United States Patent
Zheng et al.

(10) Patent No.: US 12,156,476 B2
(45) Date of Patent: Nov. 26, 2024

(54) PROGRAMMABLE MAGNETIC TUNNEL JUNCTION

(71) Applicant: GLOBALFOUNDRIES Singapore Pte. Ltd., Singapore (SG)

(72) Inventors: Ping Zheng, Singapore (SG); Eng Huat Toh, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 439 days.

(21) Appl. No.: 17/469,227

(22) Filed: Sep. 8, 2021

(65) Prior Publication Data

US 2023/0076182 A1 Mar. 9, 2023

(51) Int. Cl.
| | |
|---|---|
| H10N 50/01 | (2023.01) |
| G01K 7/36 | (2006.01) |
| G01R 33/09 | (2006.01) |
| G11C 11/16 | (2006.01) |
| H10N 50/10 | (2023.01) |
| H10N 50/80 | (2023.01) |
| H10N 50/85 | (2023.01) |
| G01R 33/00 | (2006.01) |

(52) U.S. Cl.
CPC ............ H10N 50/01 (2023.02); G01K 7/36 (2013.01); G01R 33/098 (2013.01); G11C 11/161 (2013.01); H10N 50/10 (2023.02); H10N 50/80 (2023.02); H10N 50/85 (2023.02); *G01R 33/0052* (2013.01); *G01R 33/0082* (2013.01)

(58) Field of Classification Search
CPC ........ H10N 50/01; H10N 50/80; H10N 50/10; G01K 7/36; G01R 33/098; G01R 33/0082
USPC .......................................................... 257/421
See application file for complete search history.

(56) References Cited

U.S. PATENT DOCUMENTS

| | | | |
|---|---|---|---|
| 6,100,686 A | 8/2000 | Van Delden et al. | |
| 11,585,703 B2* | 2/2023 | Liu | G01K 7/01 |
| 2017/0112175 A1 | 4/2017 | Holm | |
| 2017/0154923 A1* | 6/2017 | Johnson | G11C 11/1673 |
| 2020/0235008 A1* | 7/2020 | Wu | H01L 21/76805 |
| 2020/0335401 A1* | 10/2020 | Fan | H01L 21/76895 |
| 2021/0247470 A1* | 8/2021 | Zheng | G01R 33/098 |
| 2023/0076514 A1* | 3/2023 | Naik | G01R 33/098 |

FOREIGN PATENT DOCUMENTS

| | | |
|---|---|---|
| CN | 101278338 | 10/2008 |
| CN | 101589452 | 11/2009 |

OTHER PUBLICATIONS

Ferreira, R. et al., "2-Axis Magnetometers Based on Full Wheatstone Bridges Incorporating Magnetic Tunnel Junctions Connected in Series", IEEE Trans. on Magnetics, 2012, 48, 11, 4 pages.

(Continued)

*Primary Examiner* — Jami Valentine Miller
(74) *Attorney, Agent, or Firm* — Andrew M. Calderon; Calderon Safran & Wright P.C.

(57) ABSTRACT

The present disclosure relates to semiconductor structures and, more particularly, to temperature sensors with programmable magnetic tunnel junction structures and methods of manufacture. A structure includes a resistor material connected in series with a programmable magnetic tunnel junction structure in a Wheatstone bridge configuration.

18 Claims, 7 Drawing Sheets

(56) References Cited

OTHER PUBLICATIONS

Ogasawara, T. et al., "Effect of second-order magnetic anisotropy on nonlinearity of conductance in CoFeB/MgO/CoFeB magnetic tunnel junction for magnetic sensor devices", Scientific Reports, Nature, 2019, 9 pages.

Jeng, J. et al., "Vector Magnetometer with Dual-Bridge GMR Sensors", IEEE Trans. on Magnetics, 2014, 50,1, 2 pages.

Nakano, T. et al., "Magnetic Tunnel Junctions With [Co/Pd]-Based Reference Layer and CoFeB Sensing Layer for Magnetic Sensor", IEEE Trans. on Magnetics, 2016, 52, 7, 4 pages.

Franco, F. et al., "Reconfigurable Spintronics Wheatstone Bridge Sensors With Offset Voltage Compensation at Wafer Level", IEEE Trans. on Magnetics, 2019, 55, 7, 5 pages.

Specification and Drawings in U.S. Appl. No. 17/469,221, filed Sep. 8, 2021, 32 pages.

Office Action in U.S. Appl. No. 17/469,211 dated Feb. 1, 2023, 19 pages.

Response to Office Action in U.S. Appl. No. 17/469,211 dated Apr. 26, 2023, 8 pages.

Zhang et al., "L10-FePd Synthetic Antiferromagnet Through a Face-centered-cubic Ruthenium Spacer Utilized for Perpendicular Magnetic Tunnel Junctions", Physical Review Applied, vol. 9, Issue 4, Apr. 2018, 24 pages.

Qoutb et al., "Spintronic/CMOS-Based Thermal Sensors", IEEE ISCAS, 2020, 5 pages.

Weng et al., "A CMOS Thermistor-Embedded Continuous-Time Delta-Sigma Temperature Sensor With a Resolution FoM of 0.65 pJ C2", IEEE Journal of Solid-State Circuits, vol. 50, No. 11, Nov. 2015, 10 pages.

Choi et al., "A Compact Resistor-Based CMOS Temperature Sensor With an Inaccuracy of 0.12 ° C. (3O') and a Resolution FoM of 0.43 pJ·K2 in 65-nm CMOS", IEEE Journal of Solid-State Circuits, vol. 52, No. 12, Dec. 2018, 12 pages.

Sengupta, et al., "Magnetic Tunnel Junction as an On-Chip Temperature Sensor", Scientific Reports, Sep. 18, 2017, 8 pages.

Maciel et al., "Magnetic Tunnel Junction Applications", MDPI, Sensors, Dec. 24, 2019, 20 pages.

Shahmohammadi et al., "A Resistor-Based Temperature Sensor for MEMS Frequency References", IEEE, 2013, 4 pages.

Notice of Allowance in U.S. Appl. No. 17/469,211 dated May 24, 2023, 9 pages.

\* cited by examiner

PROGRAMMABLE MAGNETIC TUNNEL JUNCTION

FIELD OF THE INVENTION

The present disclosure relates to semiconductor structures and, more particularly, to temperature sensors with programmable magnetic tunnel junction structures and methods of manufacture.

BACKGROUND

On-chip thermal monitoring provides critical input to the power and thermal management of electronic circuits to prevent excessive temperatures which may otherwise affect the reliability of the circuit. For example, a temperature change can cause changes in operating characteristics of a memory cell. Illustratively, a threshold voltage of 1V at room temperature may turn into a threshold voltage of 900 mV as temperature increases. The change in voltage levels can then impact reading, programming, and verifying operations of the memory cell.

On-chip temperature sensors are typically used to monitor the temperature of a chip. These on-chip temperature sensors can be distributed throughout the chip. Known on-chip temperature sensors consist of resistors, metal-insulator (MIM) structures, and MOSFETs from CMOS platforms. These on-chip temperature sensors are not very sensitive to temperature changes, require complex manufacturing processes and/or occupy valuable real estate on the chip.

SUMMARY

In an aspect of the disclosure, a structure comprises a resistor material connected in series with a programmable magnetic tunnel junction structure in a Wheatstone bridge configuration.

In an aspect of the disclosure, a structure comprises: a substrate material; a resistor material contacting the substrate material; a programmable tunnel junction structure connected to the resistor material in series; and a ground line connected to the resistor material in series.

In an aspect of the disclosure, a method comprising: reading a voltage output of a first side of a Wheatstone bridge which is proportional to a diffusion region having a negative temperature dependence; reading a voltage output of a second side of the Wheatstone bridge which is proportional to a programmable tunnel junction structure having a positive temperature dependence; comparing the voltage output of the first side to the voltage output of the second side to determine a voltage differential; and correlating the voltage differential to a temperature reading.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to temperature sensors with programmable magnetic tunnel junction structures and methods of manufacture. More specifically, the present disclosure describes programmable magnetic tunnel junction structures for on chip temperature monitoring. In embodiments, the programmable magnetic tunnel junction structures may be perpendicular magnetic tunnel junction (pMTJ) structures in a Wheatstone bridge configuration. Advantageously, the programmable magnetic tunnel junction structures provide higher sensitivity to temperature, with a smaller footprint compared to CMOS resistor-based temperature sensors.

In more specific embodiments, the on chip temperature sensor comprises programmable MTJs and resistor material connected in a Wheatstone bridge configuration. The programmable MTJs may be a stack of MRAM-like MTJ materials (e.g., spin-transfer torque (STT) MRAM) programmed to a high resistance state (HRS). For example, the MTJ may be an $AlO_x$, $TiO_x$ or crystalline MgO based MTJ, amongst other known configurations. In such embodiments, the MTJ may include a free layer and a reference layer separated by a barrier layer, with the free layer having its magnetization rotating freely in response to a signal or magnetic field. (See, e.g., FIG. 6 for an illustrative non-limiting example of a MTJ contemplated for use in the present disclosure.)

As should be understood by those of ordinary skill in the art, a STT is an effect in which the orientation of a magnetic layer in the MTJ may be modified using a spin-polarized current. In embodiments, the MTJ may be switched to a high resistance state by an external magnetic field or a transistor without cycling. Moreover, in embodiments, the MTJs may act as a thermal sensor, with two states of hysteresis in an R-H loop (e.g., resistance as a function of magnetic field). The free layer of the MTJ may also be perpendicular to anisotropy (e.g., pMTJ).

The programmable magnetic tunnel junction structures of the present disclosure can be manufactured in a number of ways using a number of different tools. In general, though, the methodologies and tools are used to form structures with dimensions in the micrometer and nanometer scale. The methodologies, i.e., technologies, employed to manufacture the programmable magnetic tunnel junction structures of the present disclosure have been adopted from integrated circuit (IC) technology. For example, the structures are built on wafers and are realized in films of material patterned by photolithographic processes on the top of a wafer. In particular, the fabrication of the programmable magnetic tunnel junction structures uses three basic building blocks: (i) deposition of thin films of material on a substrate, (ii) applying a patterned mask on top of the films by photolithographic imaging, and (iii) etching the films selectively to the mask.

Figure 1A:
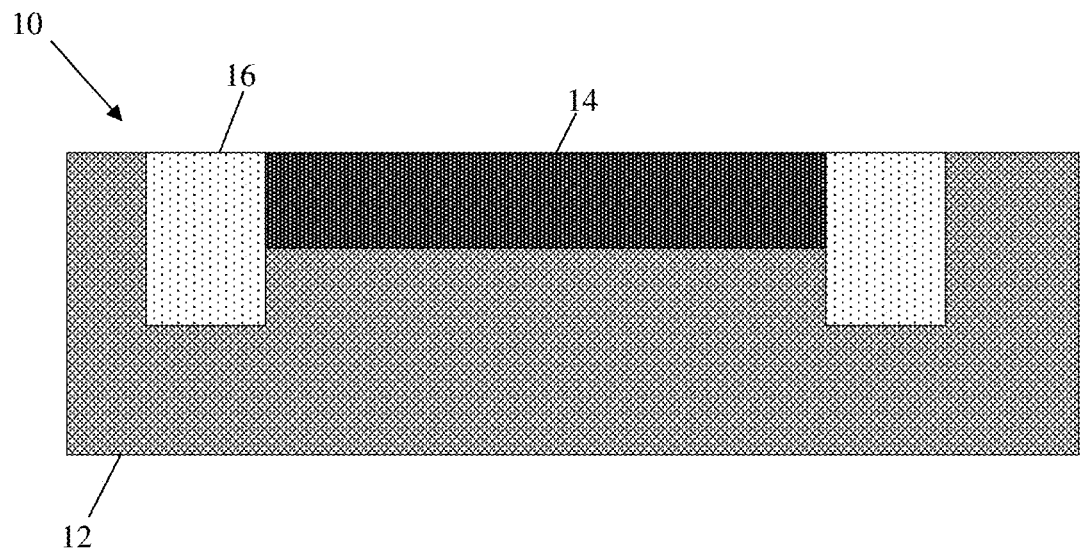
FIG. 1A shows a cross-sectional view of a substrate with shallow trench isolation structures and respective fabrication processes in accordance with aspects of the present disclosure.
Figure 1B:
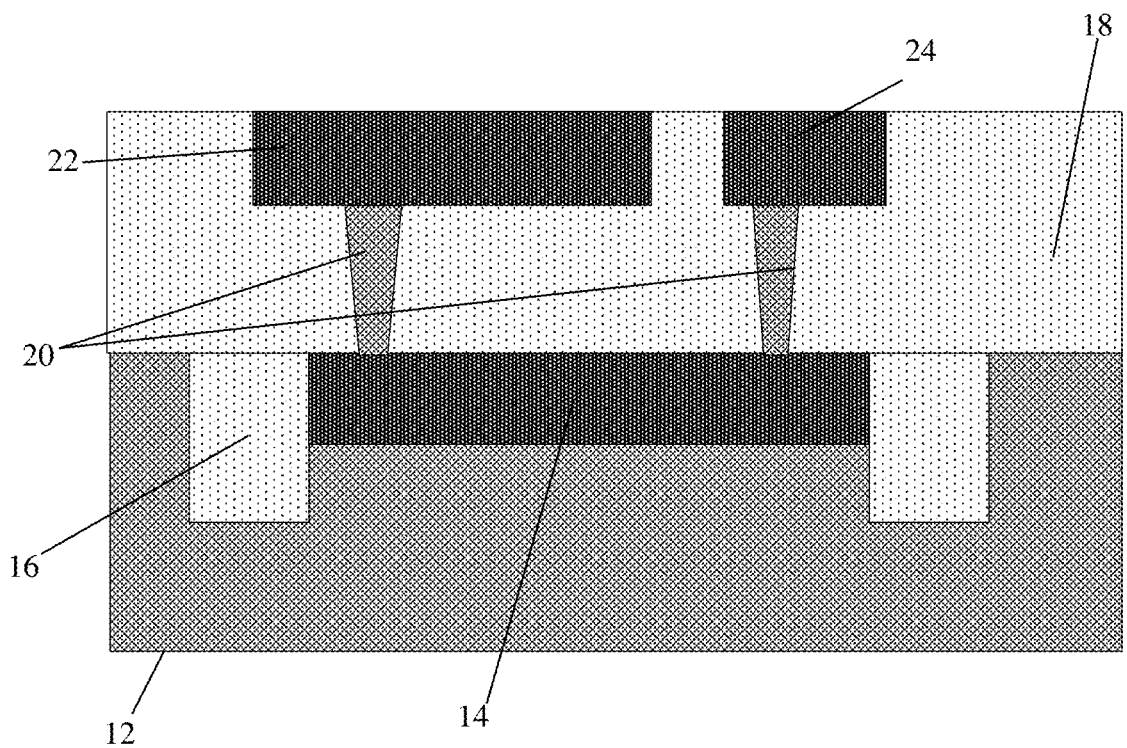
FIG. 1B shows a cross-sectional view of contacts and metal lines connecting to the substrate, amongst other features, and respective fabrication processes in accordance with aspects of the present disclosure.
Figure 1C:
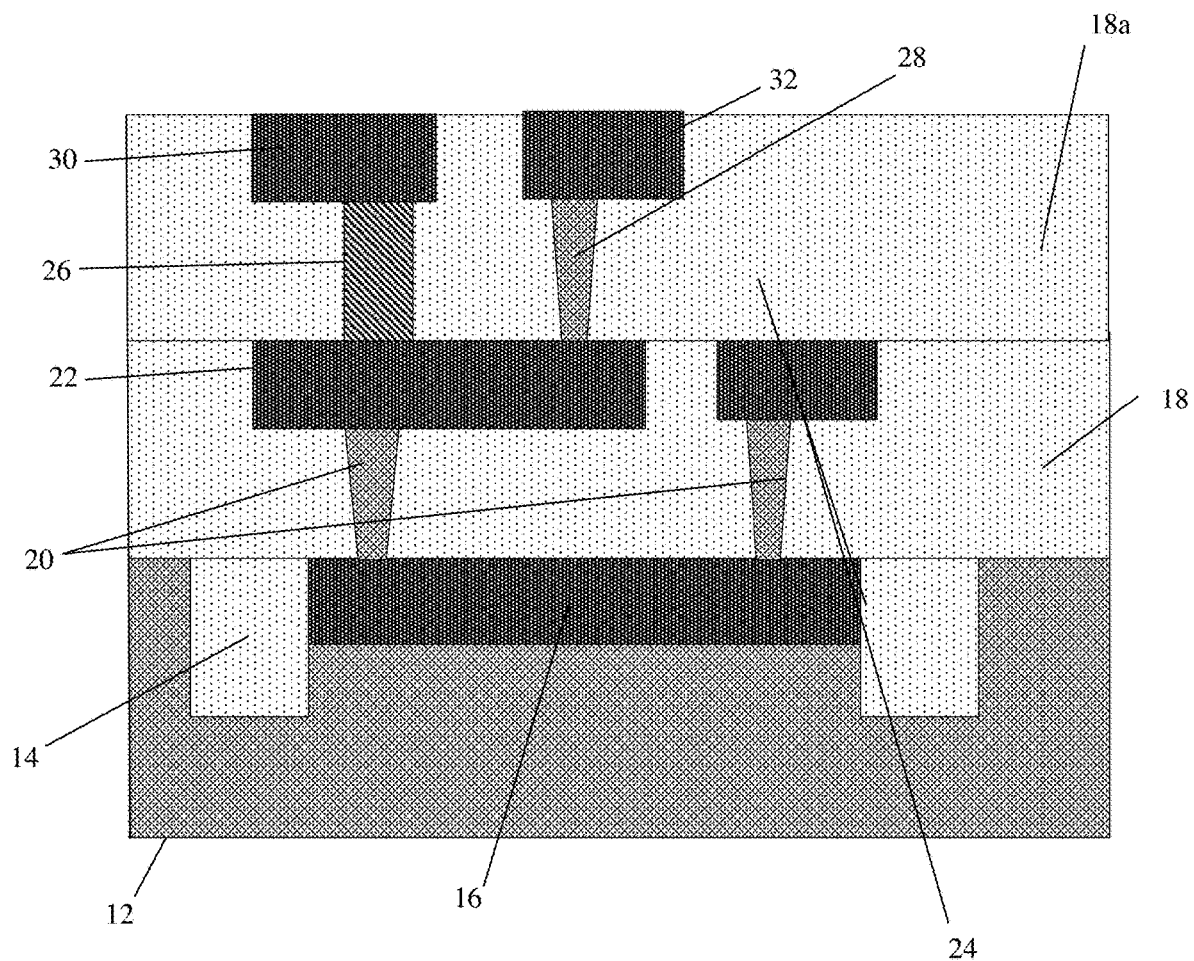
FIG. 1C shows a cross-sectional view of a magnetic tunnel junction structure and vias connecting between the metal lines of FIG. 1B and Vdd and Vout, and respective fabrication processes in accordance with aspects of the present disclosure.

FIG. 1A-1C show cross-sectional views of a fabrication process and respective on-chip temperature sensor in accordance with aspects of the present disclosure. More specifically, the structure 10 shown in FIG. 1A includes a substrate 12 comprising semiconductor material. In embodiments, the substrate 12 may a bulk substrate composed of any suitable semiconductor material including, but not limited to, Si, SiGe, SiGeC, SiC, GaAs, InAs, InP, and other III/V or II/VI compound semiconductors. The substrate 12 may also comprise any suitable crystallographic orientation (e.g., a (100), (110), (111), or (001) crystallographic orientation). Moreover, in preferred embodiments, the substrate 12 is a p-type substrate.

In alternative embodiments, the substrate 12 may be representative of a semiconductor on insulator substrate. In this implementation, an insulator layer is on top of a semiconductor layer and the substrate is on top of the insulator layer. The insulator layer comprises any suitable material, including silicon oxide, sapphire, other suitable insulating materials, and/or combinations thereof. An exemplary insulator layer may be a buried oxide layer (BOX). The insulator layer may be formed by any suitable process, such as separation by implantation of oxygen (SIMOX), oxidation, deposition, and/or other suitable process. The substrate can be fabricated using wafer bonding, and/or other suitable methods.

Still referring to FIG. 1A, an N+ diffusion region 14 may be formed in the substrate 16. In embodiments, the N+ diffusion region 14 will remain unsilicided. The N+ diffusion region 14 may be formed by introducing a dopant by, for example, ion implantation that introduces a concentration of the dopant in the substrate 12. For example, the N+ diffusion region 14 may be doped with n-type dopants, e.g., Arsenic (As), Phosphorus (P) and Sb, among other suitable examples.

In embodiments, a patterned implantation mask may be used to define selected areas exposed for the implantations, e.g., N+ diffusion region 14. The implantation mask used to select the exposed area for forming N+ diffusion region 14 is stripped after implantation. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions.

Shallow trench isolation structures 16 are formed in the substrate 12, which isolate the N+ diffusion region 14. In embodiments, the shallow trench isolation structures 16 can be formed by conventional lithography, etching and deposition methods known to those of skill in the art. For example, a resist formed over the substrate 12 is exposed to energy (light) to form a pattern (opening). An etching process with a selective chemistry, e.g., reactive ion etching (RIE), will be used to form one or more trenches in the substrate 12 through the openings of the resist. Following the resist removal by a conventional oxygen ashing process or other known stripants, insulator material, e.g., $SiO_2$, can be deposited by any conventional deposition process, e.g., chemical vapor deposition (CVD) process. Any residual insulator material on the surface of the substrate 12 or N+ diffusion region 14 can be removed by conventional chemical mechanical polishing (CMP) processes.

In FIG. 1B, contacts 20 and metal lines 22, 24 are formed in a dielectric material 18, with the contacts 20 directly contacting the N+ diffusion region 14. In embodiments, the metal line 24 may be a ground line (GND); whereas, the metal line 22 may be a wiring structure connecting to Vdd and Vout. The dielectric material 18 may be an interlevel dielectric material, e.g., $SiO_2$, formed by a deposition process such as CVD as is known by those of skill in the art such that no further explanation is required for a complete understanding of the present invention.

The contacts 20 and metal lines 22, 24 may be formed by conventional CMOS processes, e.g., lithography, etching and deposition process. For example, the contacts 20 and metal lines 22, 24 may be formed using single or dual damascene processes known in the art. The contacts 20 may comprise tungsten or aluminum; although other conductive materials are also contemplated herein. On the other hand, the metal lines 22, 24 may be composed of copper using a seed layer and, if desired, conductive liner materials known to those of skill in the art.

FIG. 1C shows a cross-sectional view of a MTJ 26 and via 28 connecting to metal lines 30, 32, amongst other features. In particular, the MTJs 26, via 28 and metal lines 30, 32 may be formed in dielectric material 18a, e.g., $SiO_2$. Again, the dielectric material 18a can be formed by a deposition process such as CVD. The metal line 30 may be representative of Vdd and metal line 32 may be representative of Vout. The metal lines 30, 32 may be composed of copper as described with respect to the metal lines 22, 24, and the via 28 may be formed from tungsten or aluminum as described with respect to the contacts 20. Moreover the MTJs 26, via 28 and metal lines 30, 32 may be formed by conventional CMOS processes as already described herein, with the MTJ 26 and via 28 directly contacting the metal line 32.

The MTJs 26 may be formed from multiple layers which can be used as a perpendicular MTJ. For example, and without limitation, the MTJs 26 may be composed of any stack of materials used for STT MRAM applications. By way of illustration, the MTJs 26 may comprise a free layer of CoFeB and tunneling barrier layer comprising MgO, with perpendicular synthetic antiferromagnetic structure. The perpendicular synthetic antiferromagnetic structure may comprise Co/Pd and Co/Pt multilayer systems. A reference layer may comprise, e.g., CoFeB/Ta/[Co/Pd]. It should be understood that other stacks of materials are also contemplated herein for the pMTJ.

Figure 1D:
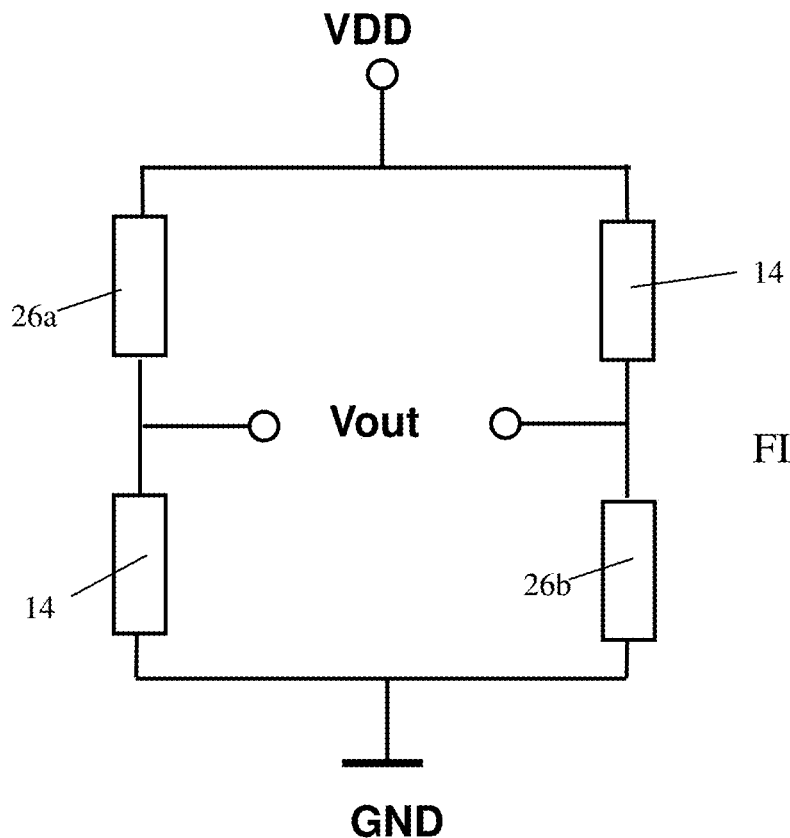
FIG. 1D is an electrical circuit diagram of the structure shown in FIG. 1C.

FIG. 1D is an electrical circuit diagram of the structure shown in FIG. 1C. More specifically, the electrical circuit diagram shows a temperature sensor comprising two MTJs 26a, 26b in series with the N+ diffusion regions 14. The combination of the MTJs in series with the N+ diffusion regions 14 forms a Wheatstone bridge. In embodiments, the MTJs are provided in a high resistance state, which may be programmed by a magnetic field (or a current) in order to be used as a temperature sensor. In the high resistance state, the magnetized direction of the free layer of the MTJ is antiparallel, e.g., perpendicular, to the reference layer.

Figure 2A:
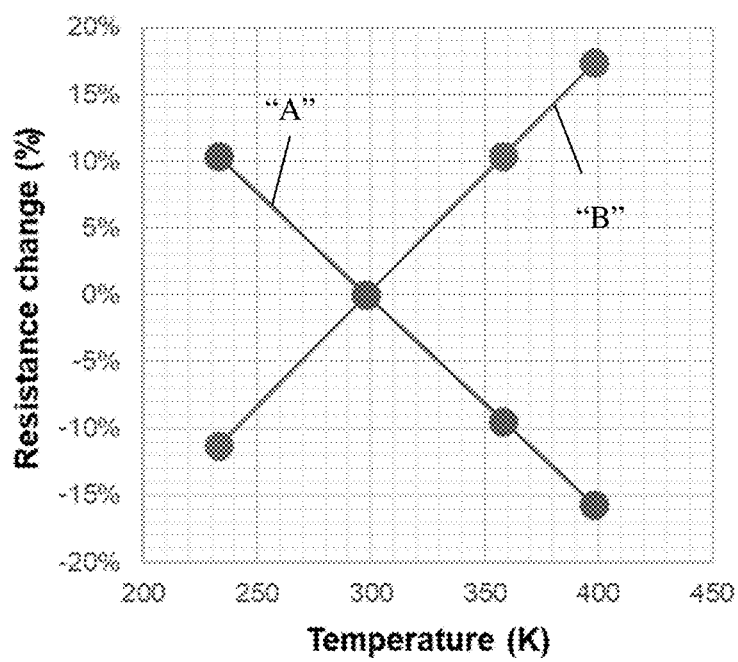
FIGS. 2A and 2B show different temperature graphs.
Figure 2B:
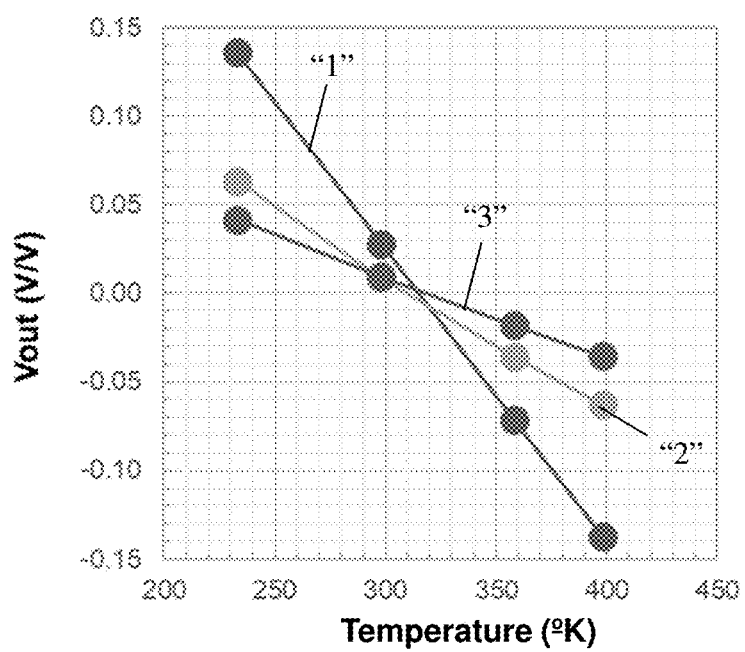

In operation, and as described in more detail with respect to FIGS. 2A and 2B, the N+ diffusion region 14 has a positive dependence on temperature and the MTJ, in a high resistance state, has a negative dependence on temperature. In this way, the Vout of the right side of the Wheatstone bridge will be proportional to the N+ diffusion region 14, whereas, the Vout of the left side of the Wheatstone bridge will be proportional to the MTJ 26b as shown below:

$$V_{out}\text{left}=Vdd*Rn\text{-diff}/(Rn\text{-diff}+Rmtj);$$

$$V_{out}\text{right}=Vdd*Rmtj/(Rn+Rmtj)/$$

(Rn–diff is the resistance of the N+ diffusion region 14 and Rmtj is the resistance of the MTJ 24.)

Accordingly, a comparison of Vout of the right side of the Wheatstone bridge to Vout of the left side of the Wheatstone bridge will show a voltage difference or drop. This voltage drop can then be mapped to a particular temperature.

FIG. 2A shows a graph of temperature (x-axis) and resistance change (y-axis) for an MTJ and N+ diffusion region as described herein. In FIG. 2A, for example, it is shown that the MTJ (line "A") and N+ diffusion region (line "B") have opposite temperature dependencies. For example, an increase of temperature will result in a decrease in resistance change for the MTJ (hence a positive temperature dependency); whereas, an increase in temperature will result in an increase in resistance for the N+ diffusion region (hence a negative temperature dependency). This relationship enhances the thermal sensitivity (e.g., approx. 1.7 mV/V/K) by approximately 2× to 4× compared to CMOS resistor based designs of a same technology node.

FIG. 2B shows a graph of temperature (x-axis) and Vout (y-axis) for an MTJ and N+ diffusion region as described herein. In FIG. 2B, line "1" represents the MTJ/N+ diffusion region combination of the present disclosure, and lines "2" and "3" represent conventional CMOS resistor designs, e.g., N diffusion regions with N polysilicon material. As shown in FIG. 2B, line "1" has a larger slope than lines "2" and "3". By having a larger slope, it is shown that Vout will change faster with a temperature change (ΔT) compared to conventional CMOS resistor configurations of lines "2" and "3". Accordingly, the temperature sensor using the MTJ structures as represented by line "1" will have a greater sensitivity to temperature change (while also having a smaller footprint) than the conventional structures represented by lines "2" and "3".

Figure 3A:
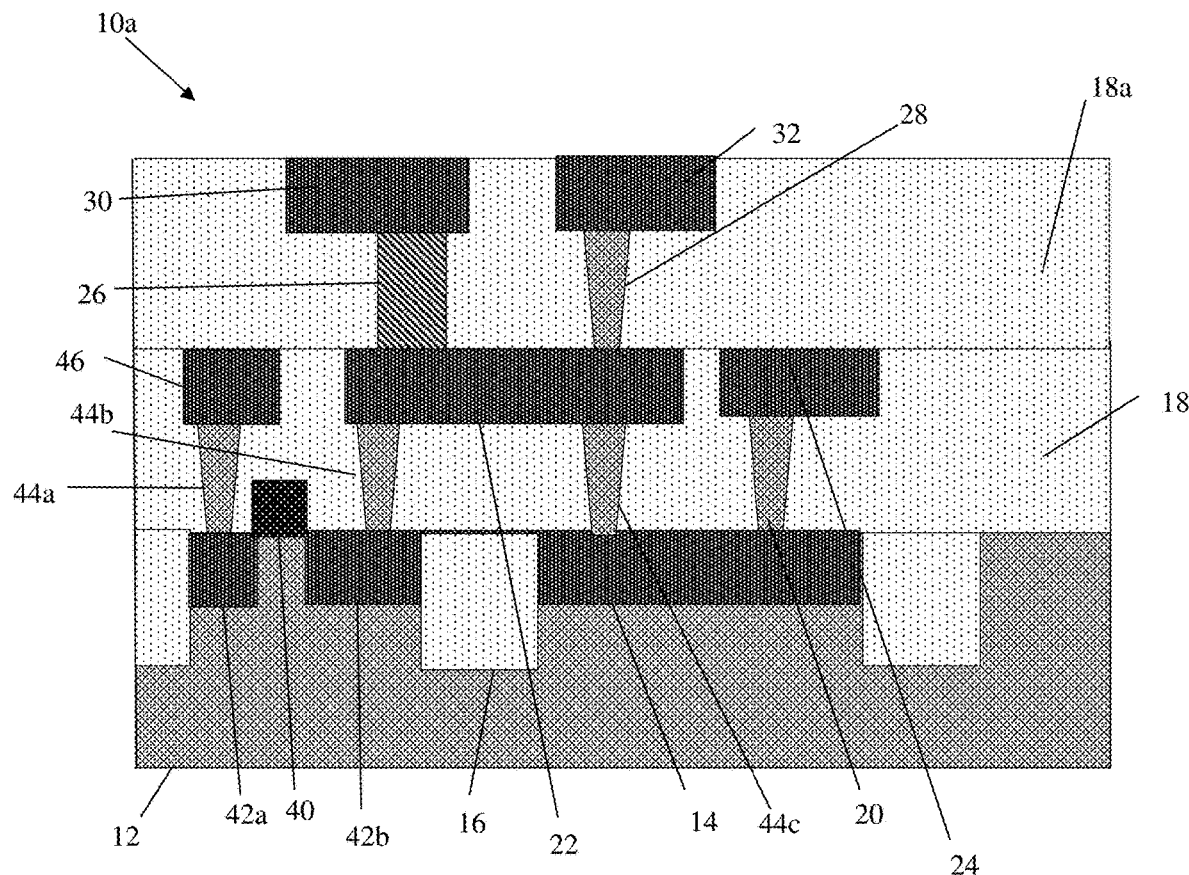
FIG. 3A shows a cross-sectional view of a temperature sensor with a magnetic tunnel junction structure and a transistor in accordance with additional aspects of the present disclosure.

FIG. 3A shows a cross-sectional view of a temperature sensor with a magnetic tunnel junction structure and transistor in accordance with additional aspects of the present disclosure. More specifically, the structure 10a of FIG. 3A shows a transistor 40 (e.g., active gated device) with a respective source region 42a and drain region 42b. In embodiments, the transistor 40 switches the MTJ 26 into a high resistance state (compared to using a magnetic field) through a contact 44b connected to the drain region 42b of the transistor 40.

More specifically, in embodiments, the transistor 40 is an active gate structure formed on a P-well. Although not critical to the understanding of the present disclosure, the device 40 (e.g., gate structures) can be fabricated using conventional CMOS processes. For example, in standard CMOS processing, a gate dielectric and polysilicon are formed, e.g., deposited, onto the substrate 12, followed by a patterning process. An insulator material such as nitride or oxide can be deposited on the patterned materials, followed by an anisotropic etching process to form sidewalls.

Additional processing includes, e.g., well implants, source/drain diffusions and silicide processes. As should be understood by those of skill in the art, the silicide process begins with deposition of a thin transition metal layer, e.g., nickel, cobalt or titanium, over fully formed and patterned semiconductor devices (e.g., source region 42a and drain region 42b and respective device 40). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. The N+ diffusion region 14 will remain unsalicided.

A contact 44 a is formed on the silicided source region 42 a and a contact 44 b is formed on the silicided drain region 42 b. Moreover, contact 44 c is formed on the unsilicided N+ diffusion region 14, connecting to both Vout and Vdd. In this way, the MTJ 26 is connected to both the N+ diffusion region 14 and the transistor 40. The contact 44 a also connects to a signal line 47. The contacts 44 a, 44 b, 44 c may be formed using conventional lithography, etching and deposition methods as is known in the art. The remaining features of FIG. 3A are similar to that already described with respect to FIG. 1C.

Figure 3B:
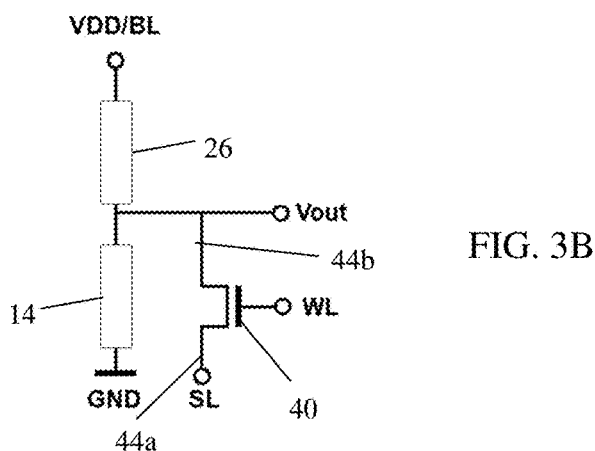
FIG. 3B is an electrical circuit diagram of the structure shown in FIG. 3A.

FIG. 3B is an electrical circuit diagram of the structure shown in FIG. 3A. It should be understood that the electric circuit diagram shows only one side of a Wheatstone bridge. As shown in this circuit diagram, the N+ diffusion region 14 and MTJ 26 are connected in series. The transistor 40 is connected to the signal line at its source region, and connected to the MTJ 26 at its drain region. In operation, the transistor 40 can turn the MTJ 26 into a high resistance state through the contact 44b, whereas, the N+ diffusion region 14 may be used in combination with the MTJ 26 as a temperature sensor as described herein.

Figure 4:
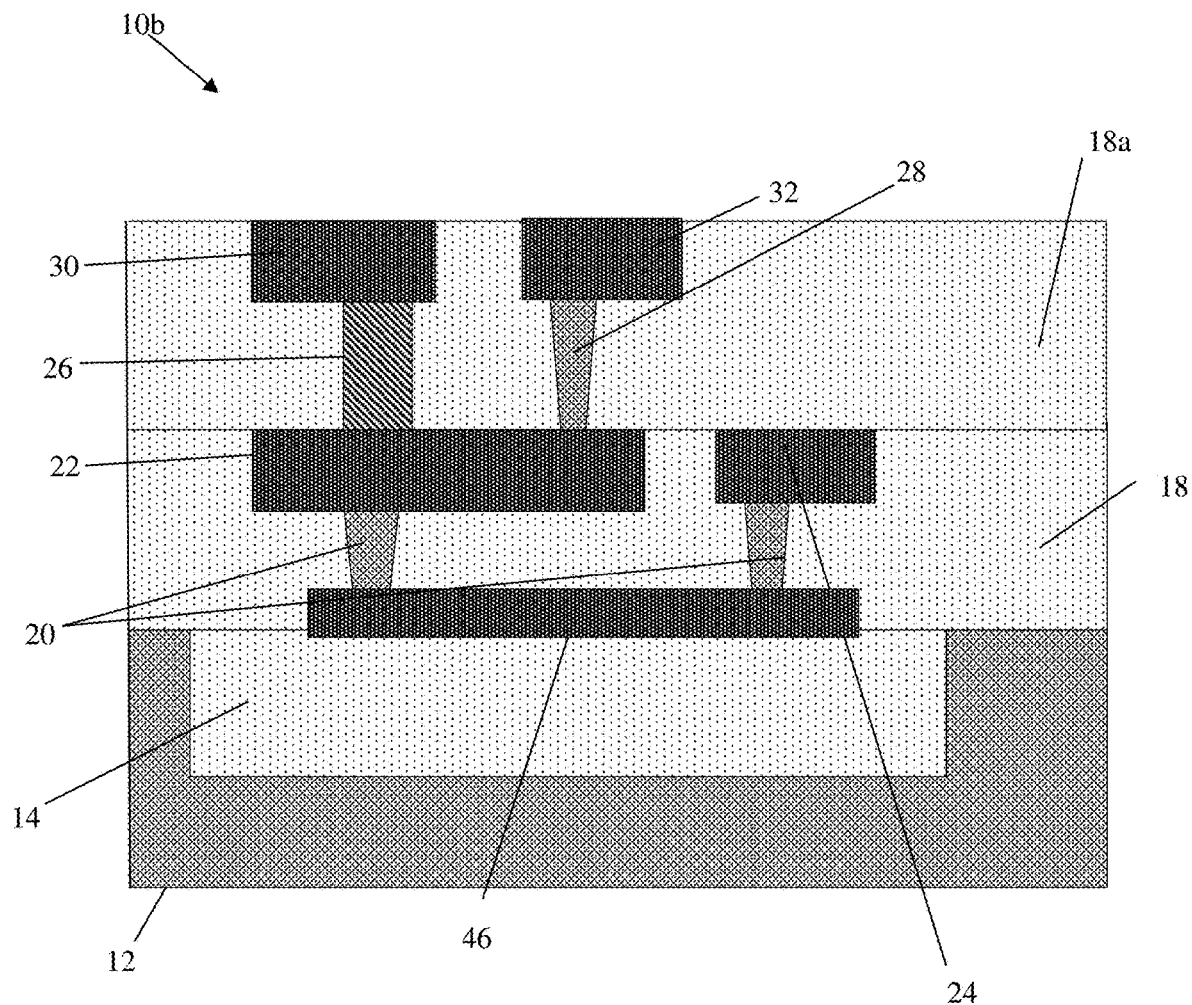
FIG. 4 shows a cross-sectional view of a temperature sensor with a magnetic tunnel junction structure in accordance with additional aspects of the present disclosure.

FIG. 4 shows a cross-sectional view of a temperature sensor with a magnetic tunnel junction structure, amongst other features, in accordance with additional aspects of the present disclosure. In the structure 10 b of FIG. 4, the N+ diffusion region is replaced with a resistor material 46 landing on the shallow trench isolation structure 16. In alternative embodiments, the resistor material 46 may land directly on the substrate 12. In either embodiment, the resistor material 46 can be any material that has a different temperature dependency (stability) than the MTJ 26, i.e., positive or no dependence on temperature. For example, the resistor material 46 can be a polysilicon material. The contacts 20 are connecting to the resistor material 46. The remaining features of FIG. 4 correspond to that shown in FIG. 1C.

Figure 5:
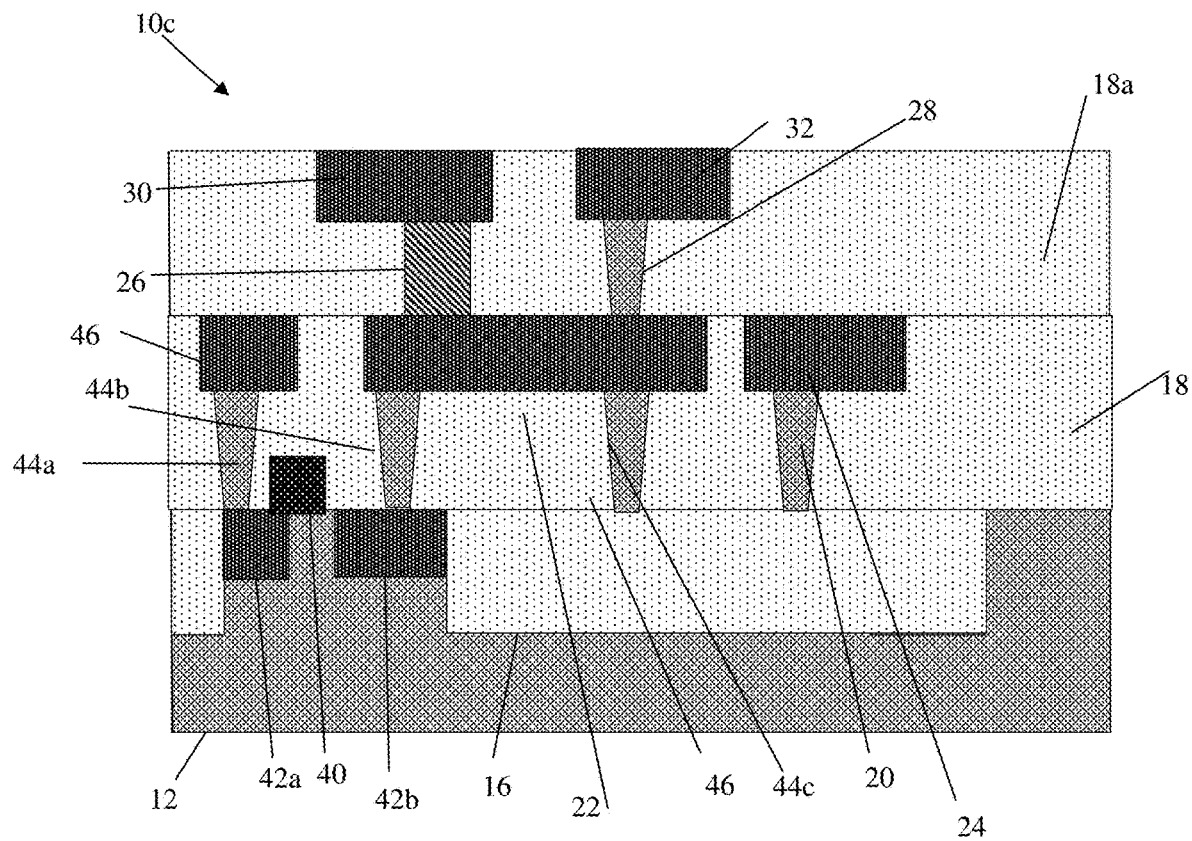
FIG. 5 shows a cross-sectional view of a temperature sensor with a magnetic tunnel junction structure in accordance with further aspects of the present disclosure.

FIG. 5 shows a cross-sectional view of a temperature sensor with a magnetic tunnel junction structure, amongst other features, in accordance with further aspects of the present disclosure. In the structure 10 c of FIG. 5, the N+ diffusion region of FIG. 3A is replaced with a resistor material 46 landing on the shallow trench isolation structure 16. In alternative embodiments, the resistor material 46 can land directly on the substrate 12. The resistor material 46 may be any material that has a different temperature dependency than the MTJ 26, i.e., positive or no dependence on temperature. For example, the resistor material 46 may be a polysilicon material. In this configuration, the contacts 44 c, 20 connect to the resistor material 46. The remaining features of FIG. 5 correspond to that shown in FIG. 3A.

Figure 6:
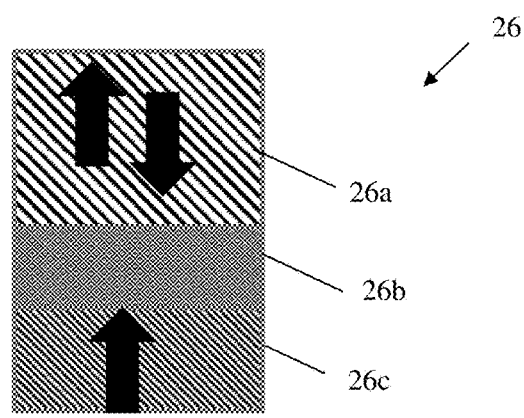
FIG. 6 shows an exemplary, illustrative magnetic tunnel junction implemented in the structures described in accordance with aspects of the present disclosure.

FIG. 6 shows an exemplary, illustrative MTJ implemented in the structures described in accordance with aspects of the present disclosure. More specifically, the MTJ 26 of FIG. 6 may be an AlO$_x$, TiO$_x$ or crystalline MgO based MTJ, amongst other known configurations. The MTJ structure 26 includes ferromagnets electrodes separated by a thin insulator, e.g., a free layer 26a and a reference layer 26c separated by a barrier layer 26b. As should be understood by those of skill in the art, the free layer 26a has its magnetization rotating freely in response to a signal or magnetic field. On the other hand, the reference layer 26c may fixed. In embodiments, the free layer 26a and fixed layer 26c may be a perpendicular free layer and perpendicular fixed layer, respectively. Also, the free layer 26a may be anti-parallel to the fixed layer 26c.

The programmable magnetic tunnel junction structures can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising diffusion regions of resistor material connected in series with programmable magnetic tunnel junction structures in a Wheatstone bridge configuration.

2. The structure of claim 1, wherein the resistor material comprises semiconductor material comprising a negative or flat temperature dependency and the magnetic tunnel junction structures comprise a positive temperature dependency.

3. The structure of claim 2, wherein the resistor material comprises an N+ diffusion region of a substrate material.

4. The structure of claim 3, further comprising a shallow trench isolation structure which isolates the N+ diffusion region from the substrate material.

5. A structure comprising resistor material connected in series with programmable magnetic tunnel junction structures in a Wheatstone bridge configuration, wherein the resistor material comprises polysilicon material, which comprises a negative or flat temperature dependency and the magnetic tunnel junction structures comprise a positive temperature dependency.

6. The structure of claim 2, wherein the Wheatstone bridge configuration comprises the resistor material of a first diffusion region of the diffusion regions connected in series to a first programmable magnetic tunnel junction structure and Vout, and the resistor material of a second diffusion region of the diffusion regions connected in series to a second programmable magnetic tunnel junction structure and Vout.

7. The structure of claim 1, wherein the magnetic tunnel junction structures comprises perpendicular magnetic tunnel junctions.

8. The structure of claim 2, further comprising a ground line connecting to the resistor material, in series.

9. The structure of claim 8, further comprising Vdd and Vout connecting to the magnetic tunnel junction structures in series.

10. The structure of claim 1, further comprising an active device connected to the magnetic tunnel junction structures.

11. The structure of claim 10, wherein a drain region of the active device connects to a first magnetic tunnel junction structure of the magnetic tunnel junction structures, and further comprising Vdd and Vout connecting to a second magnetic tunnel junction structure of the magnetic tunnel junction structures in series.

12. The structure of claim 1, wherein the magnetic tunnel junction structures are programmable into a high resistance state.

13. A structure comprising:
a substrate material;
a resistor material contacting the substrate material;
a programmable magnetic tunnel junction structure connected to the resistor material in series; and
a ground line connected to the resistor material in series, wherein the resistor material comprises one of N+ diffusion region of the substrate material and polysilicon material landing over the substrate material.

14. The structure of claim 13, wherein the programmable magnetic tunnel junction structure comprises a perpendicular programmable tunnel junction structure.

15. The structure of claim 13, wherein the programmable magnetic tunnel junction structure is connected in series between Vdd and Vout and is provided in a Wheatstone configuration with the resistor material.

16. A structure comprising:
a substrate material;
a resistor material contacting the substrate material;
a programmable magnetic tunnel junction structure connected to the resistor material in series;
a ground line connected to the resistor material in series; and
a transistor comprising a drain region connecting in series to the programmable magnetic tunnel junction structure and a source region connecting in series to a signal line.

17. A method comprising:
reading a voltage output of a first side of a Wheatstone bridge which is proportional to a diffusion region having a negative temperature dependence;
reading a voltage output of a second side of the Wheatstone bridge which is proportional to a programmable tunnel junction structure having a positive temperature dependence;
comparing the voltage output of the first side to the voltage output of the second side to determine a voltage differential; and
correlating the voltage differential to a temperature reading,
wherein the diffusion region comprises resistor material connected in series with a programmable magnetic tunnel junction structure comprising a first and second programmable magnetic tunnel junction in a Wheatstone bridge configuration.

18. The method of claim 17, wherein $$V_{out}\text{left} = Vdd*Rn\text{-diff}/(Rn\text{-diff}+Rmtj);$$

$$V_{out}\text{right} = Vdd*Rmtj/(Rn+Rmtj), \text{ where}$$

Rn–diff is a resistance of an N+ diffusion region and Rmtj is a resistance of the programmable tunnel junction structure.

\* \* \* \* \*